US009876029B2

(12) United States Patent
Fujiki et al.

(10) Patent No.: US 9,876,029 B2
(45) Date of Patent: Jan. 23, 2018

(54) SEMICONDUCTOR MEMORY DEVICE

(71) Applicant: Toshiba Memory Corporation, Minato-ku (JP)

(72) Inventors: Jun Fujiki, Mie (JP); Takeshi Kamigaichi, Yokkaichi (JP); Hideaki Aochi, Yokkaichi (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 15/266,416

(22) Filed: Sep. 15, 2016

(65) Prior Publication Data

US 2017/0278862 A1 Sep. 28, 2017

Related U.S. Application Data

(60) Provisional application No. 62/311,550, filed on Mar. 22, 2016.

(51) Int. Cl.
*H01L 29/792* (2006.01)
*H01L 29/76* (2006.01)
(Continued)

(52) U.S. Cl.
CPC ...... *H01L 27/11582* (2013.01); *H01L 23/528* (2013.01); *H01L 27/1157* (2013.01); *H01L 27/11524* (2013.01); *H01L 27/11556* (2013.01)

(58) Field of Classification Search
CPC ......... H01L 27/11582; H01L 27/11524; H01L 23/528; H01L 29/788; H01L 29/792; H01L 29/6684; H01L 27/11517; H01L 29/66825
See application file for complete search history.

(56) References Cited

U.S. PATENT DOCUMENTS 7,781,807 B2    8/2010  Nishihara et al.
8,044,448 B2 *  10/2011 Kamigaichi ........... G11C 5/025
                                                     257/296
(Continued)

FOREIGN PATENT DOCUMENTS

JP    2008-140912    6/2008
JP    2013-16781     1/2013
JP    2014-110435    6/2014

*Primary Examiner* — Whitney T Moore
*Assistant Examiner* — Damon Hillman
(74) *Attorney, Agent, or Firm* — Oblon, McClelland, Maier & Neustadt, L.L.P.

(57) ABSTRACT

A semiconductor memory device according to an embodiment comprises: a plurality of memory strings arranged in a first direction intersecting a surface of a semiconductor substrate, each of the memory strings including a plurality of memory transistors connected in series in a second direction along the surface of the semiconductor substrate; a source side select transistor connected to one end of the memory string; a drain side select transistor connected to the other end of the memory string; a plurality of source lines respectively connected, via the source side select transistor, to each of the plurality of memory strings arranged along the first direction; a bit line commonly connected, via the drain side select transistor, to the plurality of memory strings arranged along the first direction; a word line connected to a gate electrode of the memory transistor; and a layer selector disposed between the source line and the source side select transistor and commonly connected to the plurality of memory strings arranged along the first direction.

20 Claims, 17 Drawing Sheets

(51) Int. Cl.
*H01L 21/84* (2006.01)
*H01L 27/06* (2006.01)
*H01L 27/11582* (2017.01)
*H01L 27/11524* (2017.01)
*H01L 27/11556* (2017.01)
*H01L 27/1157* (2017.01)
*H01L 23/528* (2006.01)

(56) References Cited

U.S. PATENT DOCUMENTS

| | | | |
|---|---|---|---|
| 8,115,245 B2* | 2/2012 | Yoshimizu | H01L 27/11578 257/315 |
| 8,569,182 B2* | 10/2013 | Park | H01L 21/31144 257/E21.219 |
| 2012/0327714 A1 | 12/2012 | Lue et al. | |
| 2013/0062685 A1* | 3/2013 | Yasuda | H01L 21/28282 257/325 |
| 2014/0151783 A1 | 6/2014 | Park et al. | |
| 2015/0098274 A1* | 4/2015 | Rhie | G11C 16/0483 365/185.17 |

* cited by examiner

FIG. 5D

|  | WL | XWL | SGS | SGD | XSG | BL (LSG) | (XBL) | SL | XSL |
|---|---|---|---|---|---|---|---|---|---|
| Read | VR | Vread | Vread | VBL~Vread | GND | VBL | GND | GND | VBL |
| Write | Vpgm | Vpass | Vread | GND | GND | VBL | GND | GND | VBL |
| Erase | GND | GND | VeraG | VeraG | VeraG | Vera | Vera | Vera | Vera |

SEMICONDUCTOR MEMORY DEVICE

CROSS REFERENCE TO RELATED APPLICATION

This application is based upon and claims the benefit of priority from U.S. Provisional Patent Application No. 62/311,550, filed on Mar. 22, 2016, the entire contents of which are incorporated herein by reference.

FIELD

Embodiments described herein relate generally to a semiconductor memory device.

BACKGROUND

A flash memory that stores data by accumulating a charge in a charge accumulation layer or floating gate, is known. Such a flash memory is connected by a variety of systems, such as NAND type or NOR type, and configures a semiconductor memory device. In recent years, increasing of capacity and raising of integration level of such a semiconductor memory device have been proceeding. Moreover, a semiconductor memory device in which memory cells are disposed three-dimensionally (a three-dimensional type semiconductor memory device) has been proposed to achieve increased capacity and raised integration level of the semiconductor memory device. In addition, it is also being required that both increased capacity and miniaturization are achieved.

BRIEF DESCRIPTION OF THE DRAWINGS

FIG. 5D is a table showing applied voltages during the operations of the same memory cell array 1 shown in FIGS. 5A to 5C.

DETAILED DESCRIPTION

Figure 1:
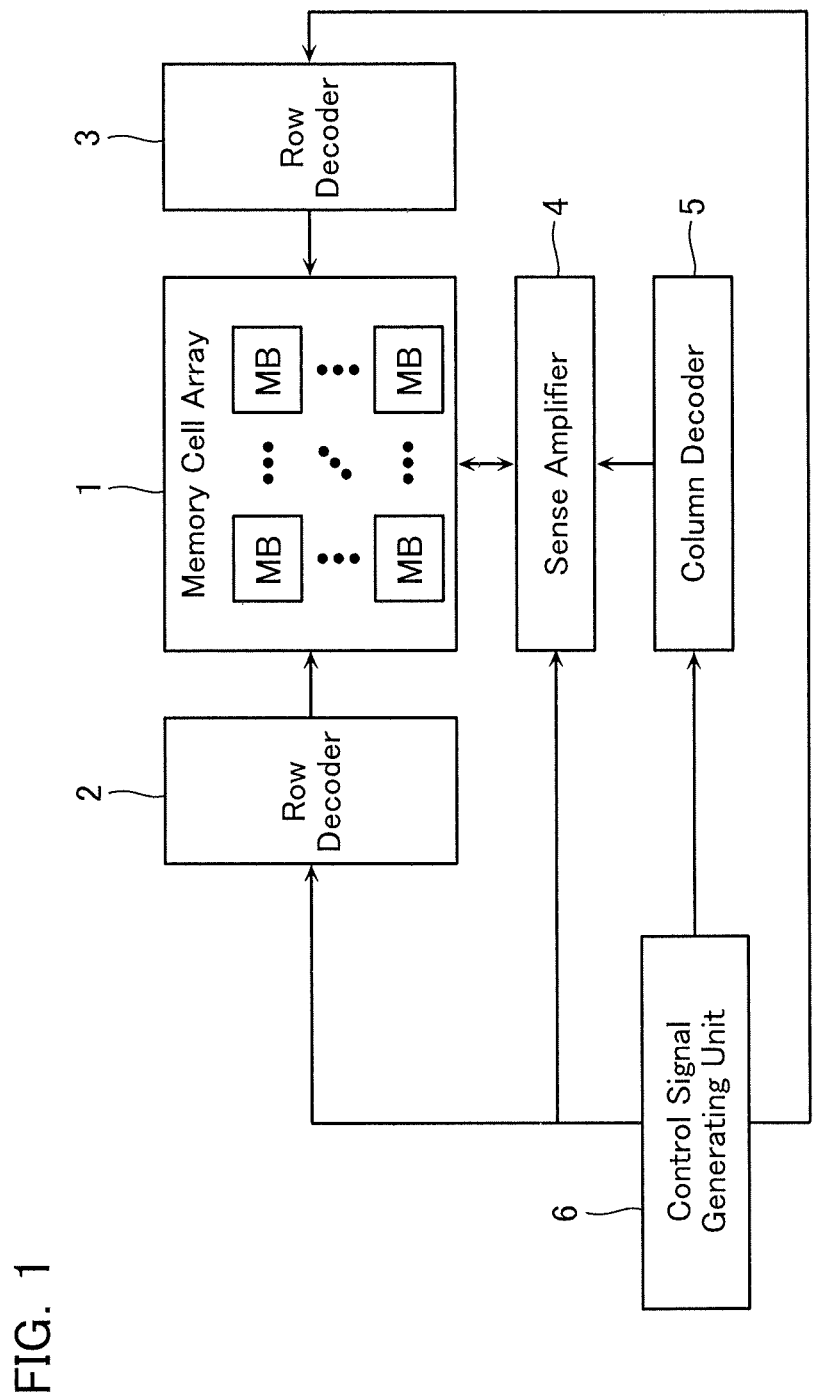
FIG. 1 is a functional block diagram showing a schematic configuration of a semiconductor memory device according to a first embodiment.

A semiconductor memory device according to an embodiment comprises: a plurality of memory strings arranged in a first direction intersecting a surface of a semiconductor substrate, each of the memory strings including a plurality of memory transistors connected in series in a second direction along the surface of the semiconductor substrate; a source side select transistor connected to one end of the memory string; a drain side select transistor connected to the other end of the memory string; a plurality of source lines respectively connected, via the source side select transistor, to each of the plurality of memory strings arranged along the first direction; a bit line commonly connected, via the drain side select transistor, to the plurality of memory strings arranged along the first direction; a word line connected to a gate electrode of the memory transistor; and a layer selector disposed between the source line and the source side select transistor and commonly connected to the plurality of memory strings arranged along the first direction.

Next, semiconductor memory devices according to embodiments will be described in detail with reference to the drawings. Note that these embodiments are merely examples. For example, each of the drawings of the semiconductor memory devices employed in the embodiments below is schematic, and thicknesses, widths, ratios, and so on, of layers are not necessarily identical to those of the actual semiconductor memory devices.

Moreover, the embodiments below relate to semiconductor memory devices having a structure in which a plurality of MONOS (Metal-Oxide-Nitride-Oxide-Semiconductor) type memory cells (transistors) are stacked along a direction intersecting a surface of a substrate (a Z direction in the drawings referred to hereafter), on the substrate, each of the MONOS type memory cells including: a semiconductor film acting as a channel provided in a direction along the substrate surface (an X direction in the drawings referred to hereafter); and a gate electrode film provided, via a charge accumulation layer, on a side surface of the semiconductor film. However, the memory cell may be a memory cell of another form, for example, a SONOS (Semiconductor-Oxide-Nitride-Oxide-Semiconductor) type memory cell or MANOS (Metal-Aluminum Oxide-Nitride-Oxide-Semiconductor) type memory cell, or a floating gate type memory cell.

First Embodiment

[Configuration]

FIG. 1 is a functional block diagram showing a configuration of a semiconductor memory device according to a first embodiment. The semiconductor memory device according to the embodiment comprises: a memory cell array 1; row decoders 2 and 3; a sense amplifier 4; a column decoder 5; and a control signal generating unit 6. The memory cell array 1 includes a plurality of memory blocks MB. Each of the memory blocks MB includes a plurality of memory cells MC (not illustrated; mentioned later in FIG. 2) arranged three-dimensionally therein. The row decoders 2 and 3 decode a downloaded block address signal, and so on, and control a write operation and a read operation of data of the memory cell array 1. The sense amplifier 4 detects and amplifies an electrical signal flowing in the memory cell array 1 during the read operation. The column decoder 5 decodes a column address signal and controls the sense amplifier 4. The control signal generating unit 6, in addition to boosting a reference voltage and generating a voltage employed during write or erase and the read operation, generates a control signal and controls the row decoders 2 and 3, the sense amplifier 4, and the column decoder 5.

Figure 2:
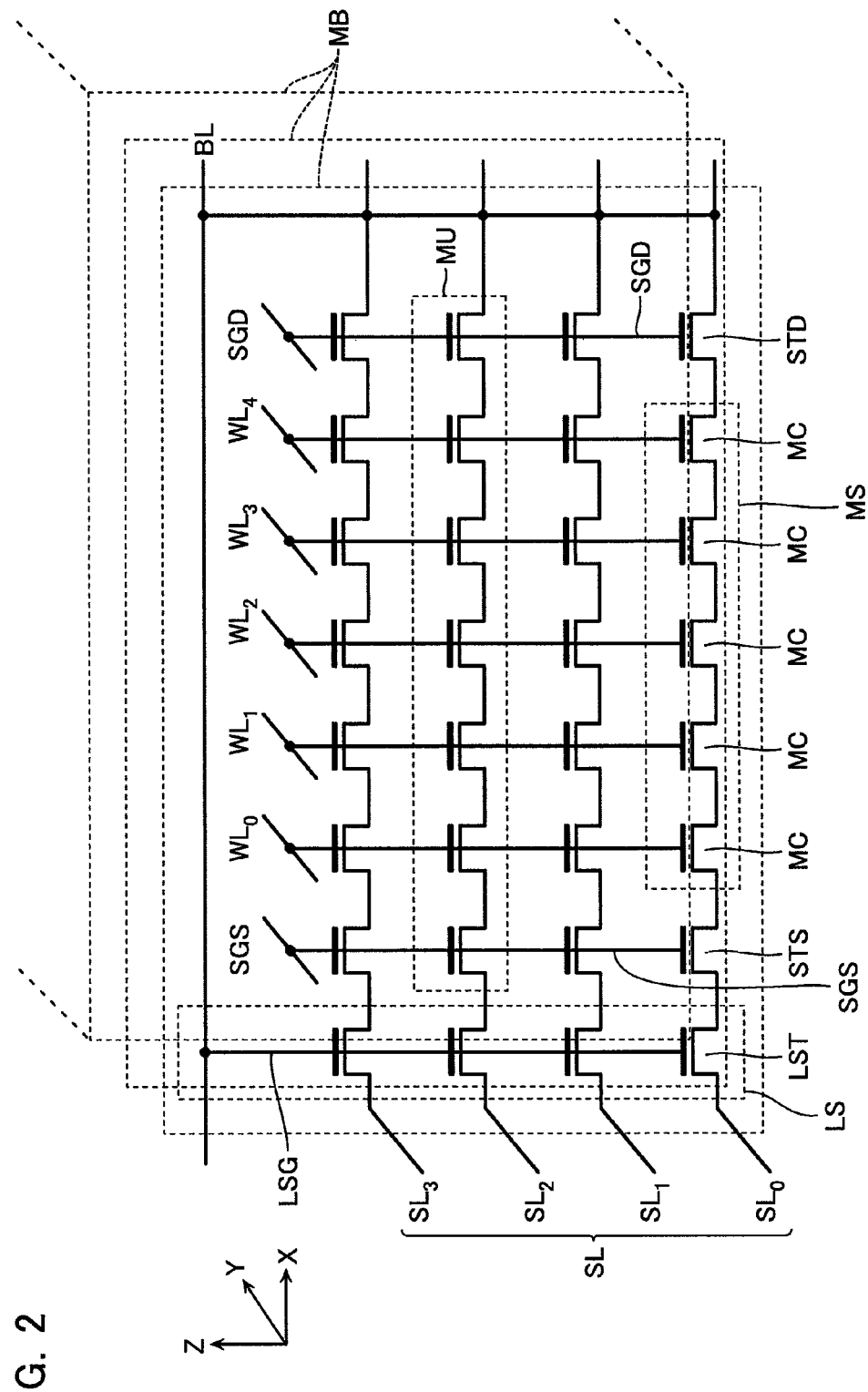
FIG. 2 is an equivalent circuit diagram showing a configuration of a memory cell array 1 of the same semiconductor memory device.

FIG. 2 is an example of an equivalent circuit diagram showing a configuration of the memory cell array 1 according to the present embodiment.

The memory cell array 1 according to the present embodiment includes a plurality of the memory blocks MB. The plurality of memory blocks MB are arranged aligned along the X direction and a Y direction. In other words, the one memory block MB shown in FIG. 2 is provided repeatedly along the X direction and the Y direction. In order to simplify explanation, one memory block MB will be described here. The memory block MB includes a plurality of memory units MU arranged in the Z direction. The memory unit MU includes: a plurality of the memory cells MC connected in series in the X direction; a drain side select transistor STD and a source side select transistor STS connected to both ends of these plurality of memory cells MC; and a layer select transistor LST connected to the source side select transistor STS. Note that hereafter, the plurality of memory cells MC connected in series will be called a "memory string MS".

As will be mentioned later, the memory cell MC comprises: a semiconductor layer; a charge accumulation layer; and a control gate. Moreover, during various operations, a charge is accumulated in the charge accumulation layer (write operation), moreover, a charge is erased from the charge accumulation layer (erase operation), based on a voltage applied to the control gate, whereby a threshold value of the memory cell MC is changed. Data stored in the memory cell MC is determined (read operation) by detecting a magnitude of this threshold value. Connected to a source side select transistor STS side of the memory block MB are a plurality of source lines SL. The source line SL extends in the Y direction and is shared between the plurality of memory blocks MB arranged along the Y direction. The plurality of source lines SL are arranged along the Z direction. One source line SL is provided to every one memory unit MU included in one memory block MB. In other words, in one memory block MB, the memory units MU and the source lines SL correspond one-to-one.

Connected to a drain side select transistor STD side of the memory block MB is a bit line BL. The bit line BL extends in the X direction and the Z direction and is shared between the plurality of memory units MU configuring one memory block MB. In this respect, the bit line BL differs from the source lines SL which are provided individually to each memory unit MU. The bit lines BL are arranged in each of the plurality of memory blocks MB arranged along the Y direction, and different fellow bit lines BL are insulated from each other. In other words, the bit lines BL are provided separately to each of the memory blocks MB.

Commonly connected to the control gates of pluralities of the memory cells MC arranged aligned in the Z direction are word lines WL extending in the Z direction. These pluralities of memory cells MC are connected to the row decoder (refer to FIG. 1) via the word lines WL.

Similarly, commonly connected to the control gates of the plurality of drain side select gate transistors STD arranged aligned in the Z direction is a drain side select gate line SGD. The drain side select gate line SGD is connected to the row decoder (refer to FIG. 1) and selectively connects the memory string MS and the bit line BL based on an inputted signal.

Similarly, commonly connected to the control gates of the plurality of source side select gate transistors STS arranged aligned in the Z direction is a source side select gate line SGS. The source side select gate line SGS is connected to the row decoder (refer to FIG. 1) and selectively connects the memory string MS and the source line SL based on an inputted signal.

The above-described word lines WL, drain side select gate line SGD, and source side select gate line SGS extend also in the Y direction and are shared between the plurality of memory blocks MB arranged in plurality along the Y direction.

In the present embodiment, the memory block MB comprises the layer select gate transistor LST disposed between the source line SL and the source side select gate transistor STS. A plurality of the layer select gate transistors LST are arranged aligned in the Z direction, one for each memory unit MU. Commonly connected to the control gates of these plurality of layer select gate transistors LST is a layer select gate line LSG extending in the Z direction. The layer select gate line LSG is connected to the bit line BL and selects the memory block MB based on a signal inputted to the bit line BL. In other words, based on a signal inputted to the bit line BL, on/off of the layer select gate transistor LST connected to the layer select gate line LSG is switched, and connection between the plurality of memory strings MS included in the memory block MB and the source line SL is switched. Hereafter, the layer select gate transistor LST and the layer select gate line LSG will be referred to collectively as a "layer selector LS". Note that similarly to the bit line BL, the layer selector LS is also provided separately to each of the memory blocks MB.

Figure 3A:
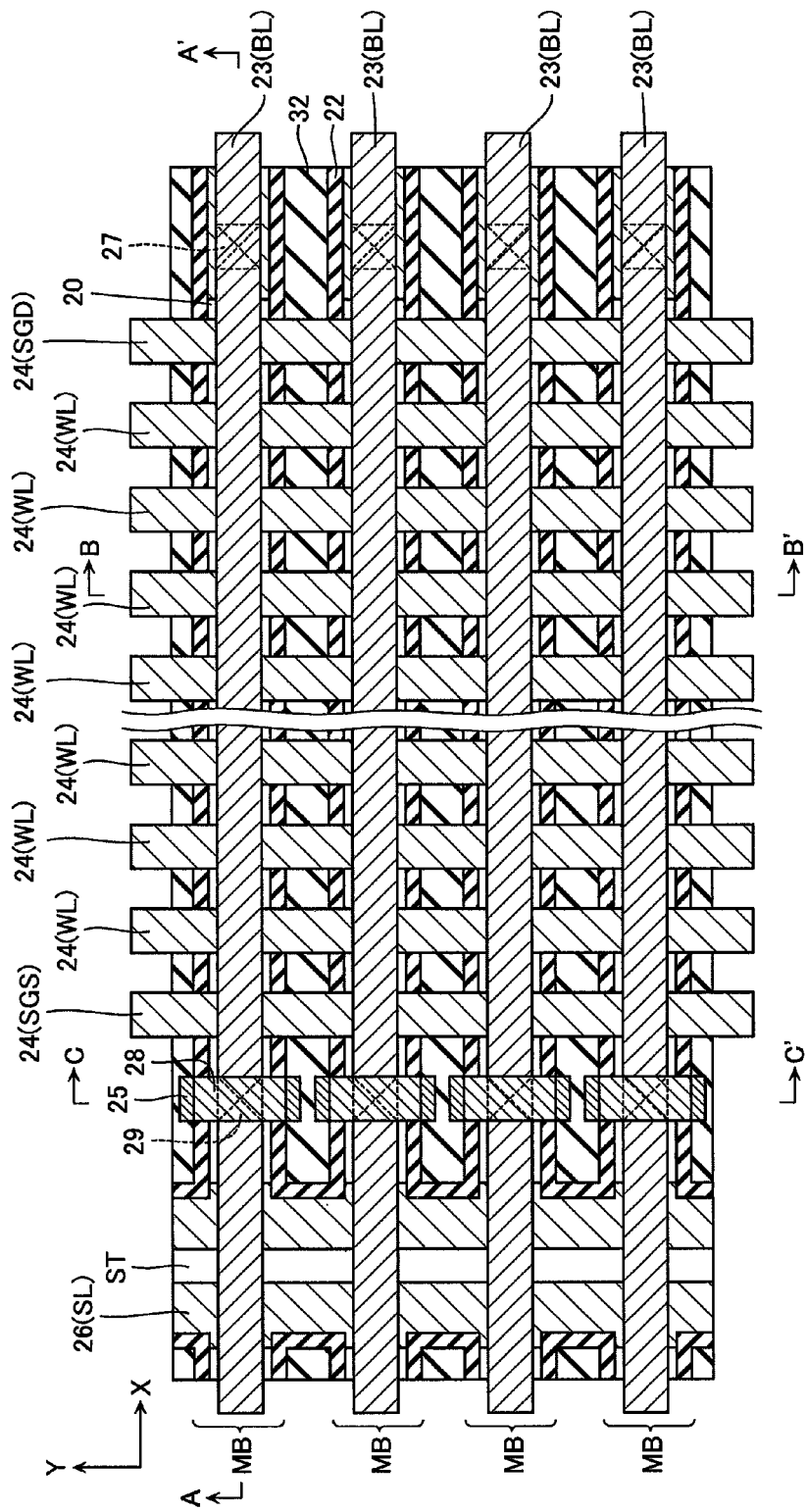
FIGS. 3A and 3B are schematic X-Y plane views showing configurations of the same memory cell array 1.
Figure 3B:
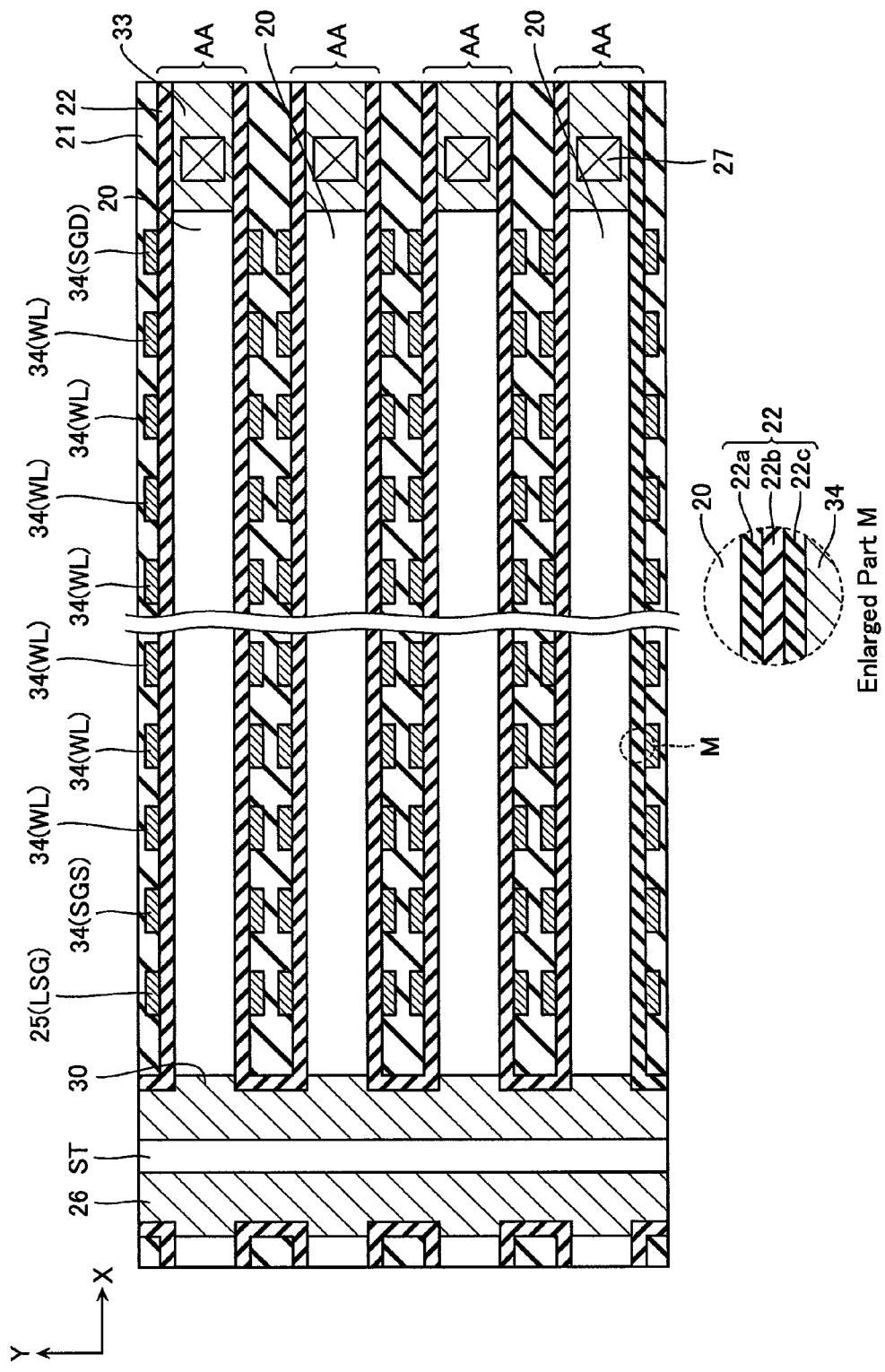

Next, a specific configuration of the memory cell array 1 according to the present embodiment will be described. FIG. 3A is an X-Y plane view of the memory cell array 1 according to the present embodiment; and, similarly, FIG. 3B is an X-Y plane view of the memory cell array 1, having all or part of a conductive layer 23 (bit line BL) and a conductive layer 24 (word line WL, source side select gate line SGS, and drain side select gate line SGD) removed from FIG. 3A. Moreover, FIGS. 3A and 3B describe as an example a configuration in which four memory blocks MB are disposed along the Y direction. Note that in the drawings below, in order to explain the configuration of the memory cell array 1 with a focus on configurations related to operations, such as an electrode or wiring line, illustration of the likes of an inter-layer insulating layer or hard mask is sometimes omitted.

As shown in FIG. 3A, the conductive layer 23 extends in the X direction and is arranged in plurality along the Y direction. The conductive layer 23 functions as the bit line BL. Moreover, insulation between the conductive layers 23 arranged along the Y direction is performed by an unillustrated inter-layer insulating layer.

A plurality of the conductive layers 24 are arranged in the X direction and each conductive layer 24 extends in the X direction. The conductive layer 24 functions as the word line WL, the drain side select gate line SGD, or the source side select gate line SGS. The conductive layer 24 on the rightmost side in FIG. 3A functions as the drain side select gate line SGD. The conductive layer 24 on the leftmost side in FIG. 3A functions as the source side select gate line SGS.

A conductive layer 29 and a conductive layer 28 are provided on the side of the conductive layer 24 that functions as the source side select gate line SGS. The conductive layer 29 and the conductive layer 28 function as a layer selector contact that are coupled to the conductive layer 23 (bit line BL) and the layer select gate line LSG (refer to FIGS. 3B, 4A, and so on).

A conductive layer 26 is provided on the side of the conductive layer 28. The conductive layer 26 extends in the Y direction. The conductive layer 26 functions as the source line SL. A slit ST is disposed in the center of the source line SL. The memory cell array 1 of the present embodiment has a symmetrical configuration in the X direction bounded by this slit ST.

As shown in FIG. 3B, in the memory cell array 1 according to the present embodiment, a semiconductor layer 20 is disposed in a position overlapping that of the conductive layer 23 (bit line BL) of FIG. 3A, when viewed in the Z direction. In other words, the conductive layer 20 extends in the X direction and is arranged in plurality in the Y direction. The semiconductor layer 20 extending in the X direction configures a channel body of the memory string MS. That is, a region where the semiconductor layer 20 is disposed forms an active area AA. Polysilicon, for example, may be adopted in the semiconductor layer 20, but a material adopted, provided it is a semiconductor material, is not limited to polysilicon.

A memory film 22 is provided on a Y direction side surface of the semiconductor layer 20. As shown in the enlarged part M, the memory film 22 has, for example, a tunnel insulating film 22a, a charge accumulation film 22b, and a block insulating film 22c stacked in this order from a semiconductor layer 20 side to a conductive layer 34 side. The tunnel insulating film 22a is configured from an insulating film of the likes of silicon oxide, for example. The charge accumulation film 22b is configured from an insulating film capable of accumulating a charge, of the likes of silicon nitride, for example. The block insulating film 22c is configured from an insulating film of the likes of silicon oxide, hafnium oxide (HfOx), or tantalum oxide (TaOx), for example.

The conductive layer 34 is provided on a side surface on an opposite side to the semiconductor layer 20 side, of the memory film 22. The conductive layer 34 functions as the drain side select gate line SGD, the word line WL, or the source side select gate line SGS.

A conductive layer 25 is provided on the side of the conductive layer 34 that functions as the source side select gate line SGS. The conductive layer 25 functions as the previously mentioned layer select gate line LSG.

A bit line lead terminal 33 and a bit line contact 27 are disposed at a drain side end of the semiconductor layer 20. The semiconductor layer 20 and the conductive layer 23 (bit line BL) are connected via the bit line lead terminal 33 and the bit line contact 27. A source line lead terminal 30 is disposed at a source side end of the semiconductor layer 20.

On the other hand, the semiconductor layer 20 and the conductive layer 26 (source line SL) are connected via the source line lead terminal 30.

Note that the conductive layers 23 to 26, and 28, the bit line contact 27, the layer selector contact 29, the source line lead terminal 30, and the bit line lead terminal 33 may be configured from a semiconductor such as polysilicon or from a metal, for example.

Figure 4A:
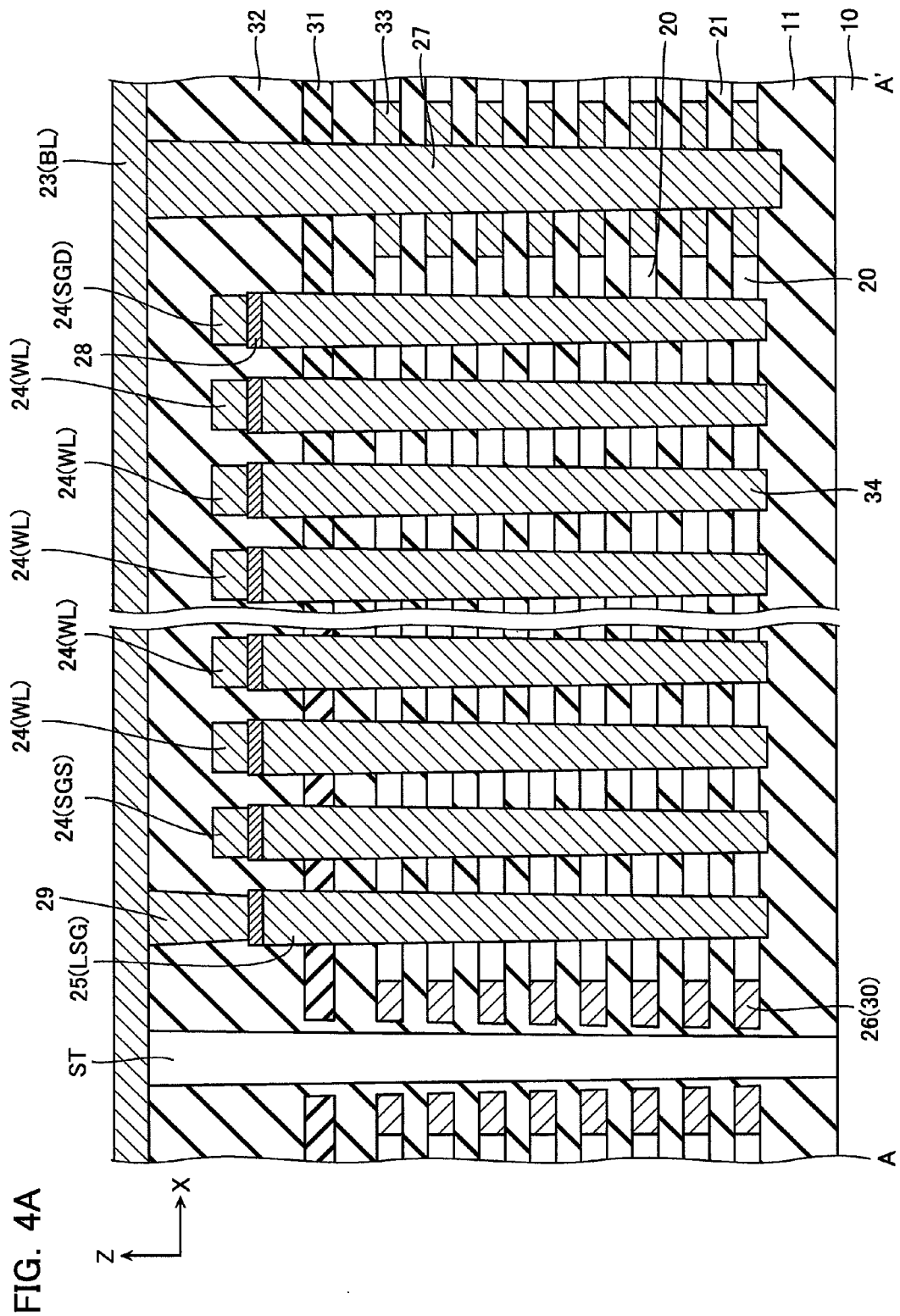
FIG. 4A is a schematic X-Z cross-sectional view, taken along the line A-A' of FIG. 3A, showing a configuration of the same memory cell array 1.
Figure 4B:
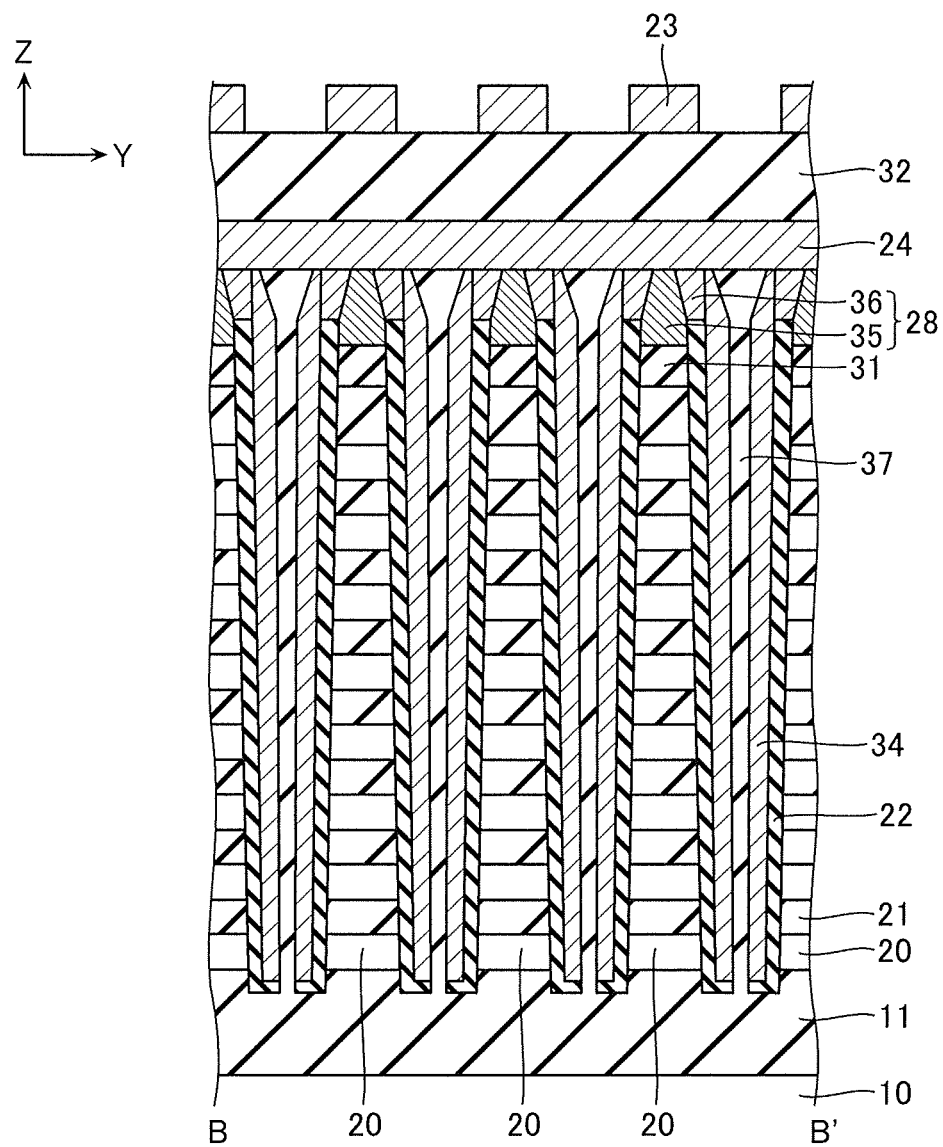
FIGS. 4B and 4C are schematic Y-Z cross-sectional views, respectively taken along the lines B-B' and C-C' of FIG. 3A, showing configurations of the same memory cell array 1.
Figure 4C:
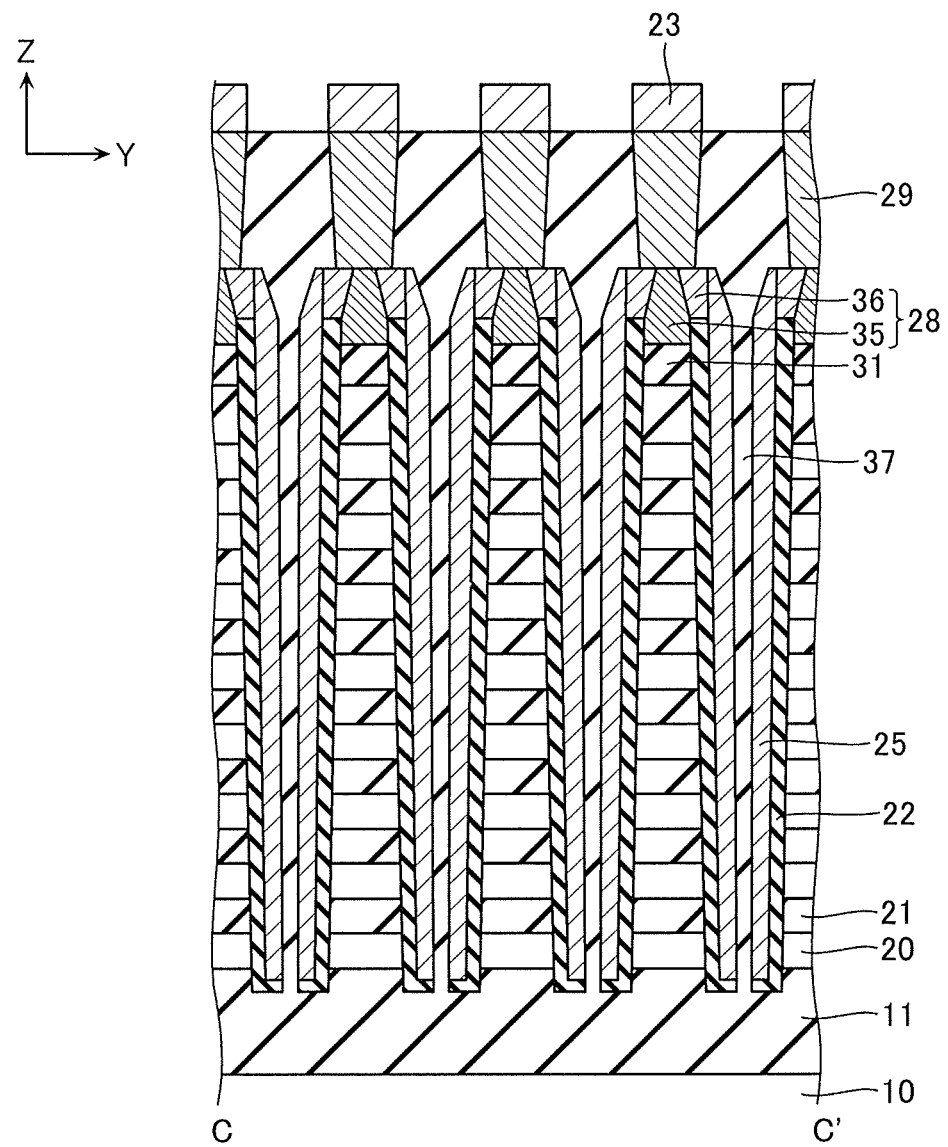

FIG. 4A is an X-Z cross-sectional view of the memory cell array 1 according to the present embodiment; and, similarly, FIGS. 4B and 4C are Y-Z cross-sectional views of the memory cell array 1. FIGS. 4A to 4C are cross-sectional views respectively taken along the lines A-A', B-B', and C-C' of FIG. 3A.

The memory cell array 1 comprises a plurality of the semiconductor layers 20 stacked in the Z direction, via inter-layer insulating layers 21, on a semiconductor substrate 10. A hard mask 31 is disposed above the uppermost layer inter-layer insulating layer 21. An inter-layer insulating layer 32 is disposed on an upper part of the hard mask 31. The inter-layer insulating layer 21, the hard mask 31, and the inter-layer insulating layer 32 may be configured from an insulating material such as silicon oxide.

As previously mentioned, the semiconductor layer 20 and the conductive layer 23 (bit line BL) are connected via the bit line lead terminal 33 and the bit line contact 27. As shown in FIG. 4A, the bit line lead terminal 33 is provided to each of the plurality of semiconductor layers 20 stacked in the Z direction. The bit line contact 27 is provided laterally of the plurality of bit line lead terminals 33. The bit line contact 27 has its upper end connected to the conductive layer 23, and has its side surface commonly connected to the plurality of bit line lead terminals 33. Moreover, the bit line contact 27 extends in the Z direction so as to penetrate the inter-layer insulating layer 32 and such that a lower end of of the bit line contact 27 reaches a gate insulating layer 11. When, for example, the bit line contact 27 is configured from a semiconductor, a sidewall of the bit line contact 27 may be implanted with an impurity or may be silicided to lower a wiring line resistance of the bit line contact 27.

Similarly, the source line lead terminal 30 that connects the semiconductor layer 20 and the conductive layer 26 (source line SL) is provided to each of the semiconductor layers 20 stacked in the Z direction. Moreover, when, for example, the source line lead terminal 30 is configured from a semiconductor, the source line lead terminal 30 may undergo implantation of an impurity or siliciding to reduce its wiring line resistance. These implantation of an impurity or siliciding are executed via the slit ST provided in the conductive layer 26.

The conductive layer 34 and the conductive layer 24 are connected via the conductive layer 28. Describing this point in detail, as shown in FIG. 4B, the conductive layer 34 is provided extending in the Z direction on a Y direction side surface on an opposite side to the semiconductor layer 20, of the memory film 22. The conductive layer 34 functions as a control gate electrode of each of the plurality of memory cells MC provided along the Z direction. That is, the conductive layer 34, along with the conductive layer 24, functions as the word line WL. The conductive layer 34 is divided by a core insulating layer 37, between the semiconductor layers 20 arranged along the Y direction. On the other hand, a pair of the conductive layers 34 that face each other sandwiching the semiconductor layer 20 are electrically connected by a contact electrode 35 provided on an upper part of the hard mask 31 and an implanted electrode 36 provided laterally of the contact electrode 35, and are also connected to the conductive layer 24. In this way, the contact electrode 35 and the implanted electrode 36 function as a word line contact 28.

The conductive layer 34, the contact electrode 35, and the implanted electrode 36 may be configured from doped polysilicon or a metal, for example. The core insulating layer 37 may be configured from an insulating material such as silicon oxide.

Note that FIG. 4B shows a configuration of the word line WL. However, the source side select gate line SGS and the drain side select gate line SGD connected to both ends of the memory string MS also have a similar configuration.

The conductive layer 25 and the conductive layer 23 are connected via the conductive layer 28 and the conductive layer 29. Describing this point in detail, as shown in FIG. 4C, the conductive layer 29 (layer selector contact 29) is provided, via the conductive layer 28 configured from the contact electrode 35 and the implanted electrode 36, on an upper part of the conductive layer 25 (layer select gate line LSG) which is provided laterally of the source side select gate line SGS. The conductive layer 25 is connected to the conductive layer 23 (bit line BL) via the conductive layer 28 and the layer selector contact 29. In this way, the conductive layer 25, the conductive layer 28, and the layer selector contact 29 configure the layer selector LS.

[Operations]

A method of operating the memory cell array 1 according to the first embodiment will be described using FIGS. 5A to 5D.

Figure 5A:
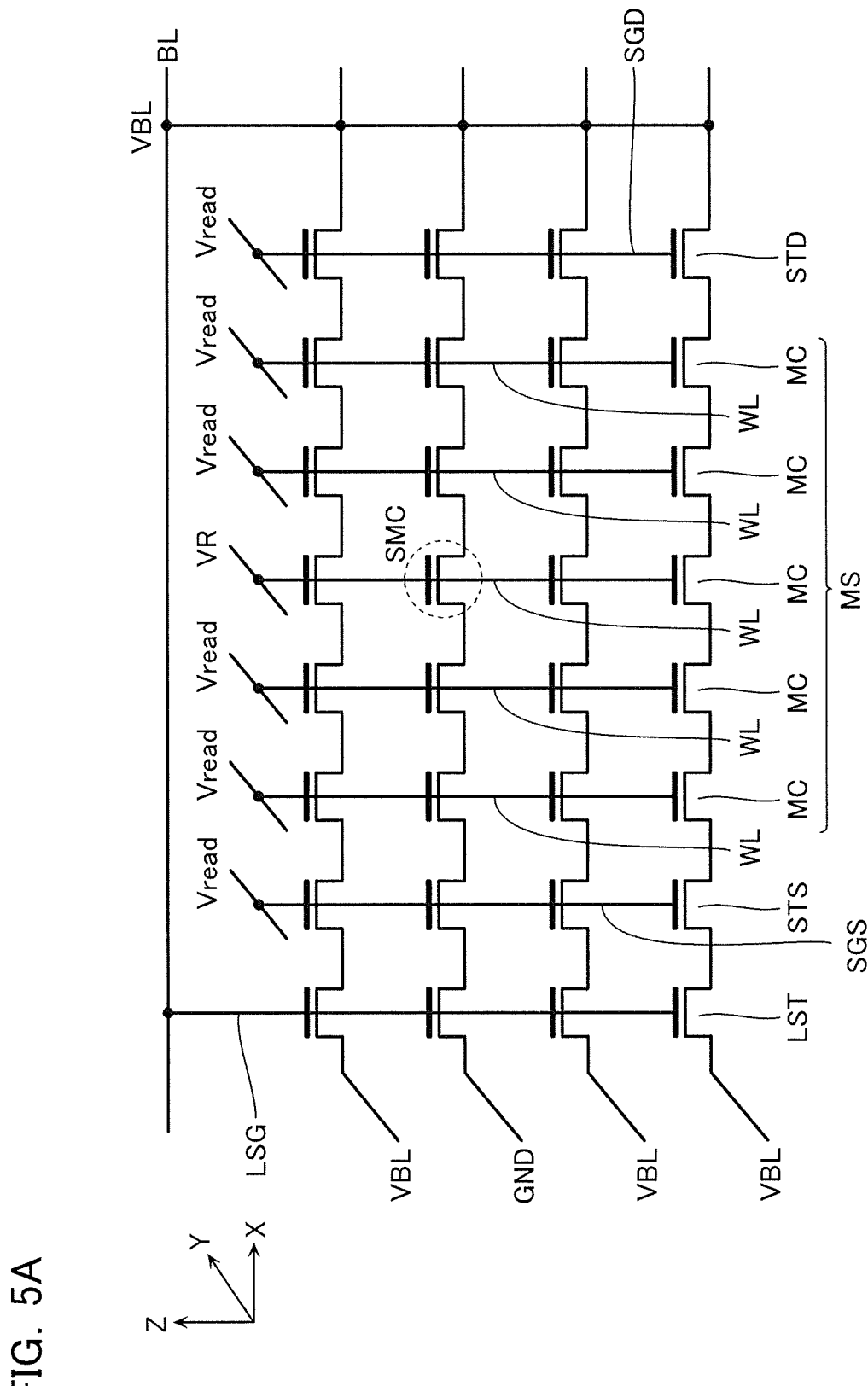
FIGS. 5A to 5C are circuit diagrams explaining operations of the same memory cell array 1.

During the read operation, as shown in FIG. 5A, the bit line BL (layer select gate line LSG) connected to the memory block MB in which a selected memory cell SMC is included, is provided with a bit line voltage VBL. In order to set the layer select gate transistor LST to an ON state, the bit line voltage VBL is set to a higher value than a threshold value of the layer select gate transistor LST. The word line WL connected to the selected memory cell SMC is provided with a voltage VR, and unselected word lines WL and the source side select gate line SGS are provided with a read voltage Vread. The drain side select gate line SGD is provided with the bit line voltage VBL. The source line SL connected to the selected memory cell SMC is provided with a ground voltage GND, and unselected source lines SL are provided with the bit line voltage VBL. Thereupon, ON/OFF of the selected memory cell SMC switches by whether the voltage VR of the selected memory cell SMC exceeds a threshold value of the selected memory cell SMC or not. At that time, for example, the likes of whether a current flows in the bit line BL or not is detected by the sense amplifier connected to the bit line BL, and data (0 or 1) stored by the selected memory cell SMC is determined. Note that the bit line BL or layer select gate line LSG connected to other memory blocks MB arranged in the Y direction is provided with the ground voltage GND.

Figure 5B:
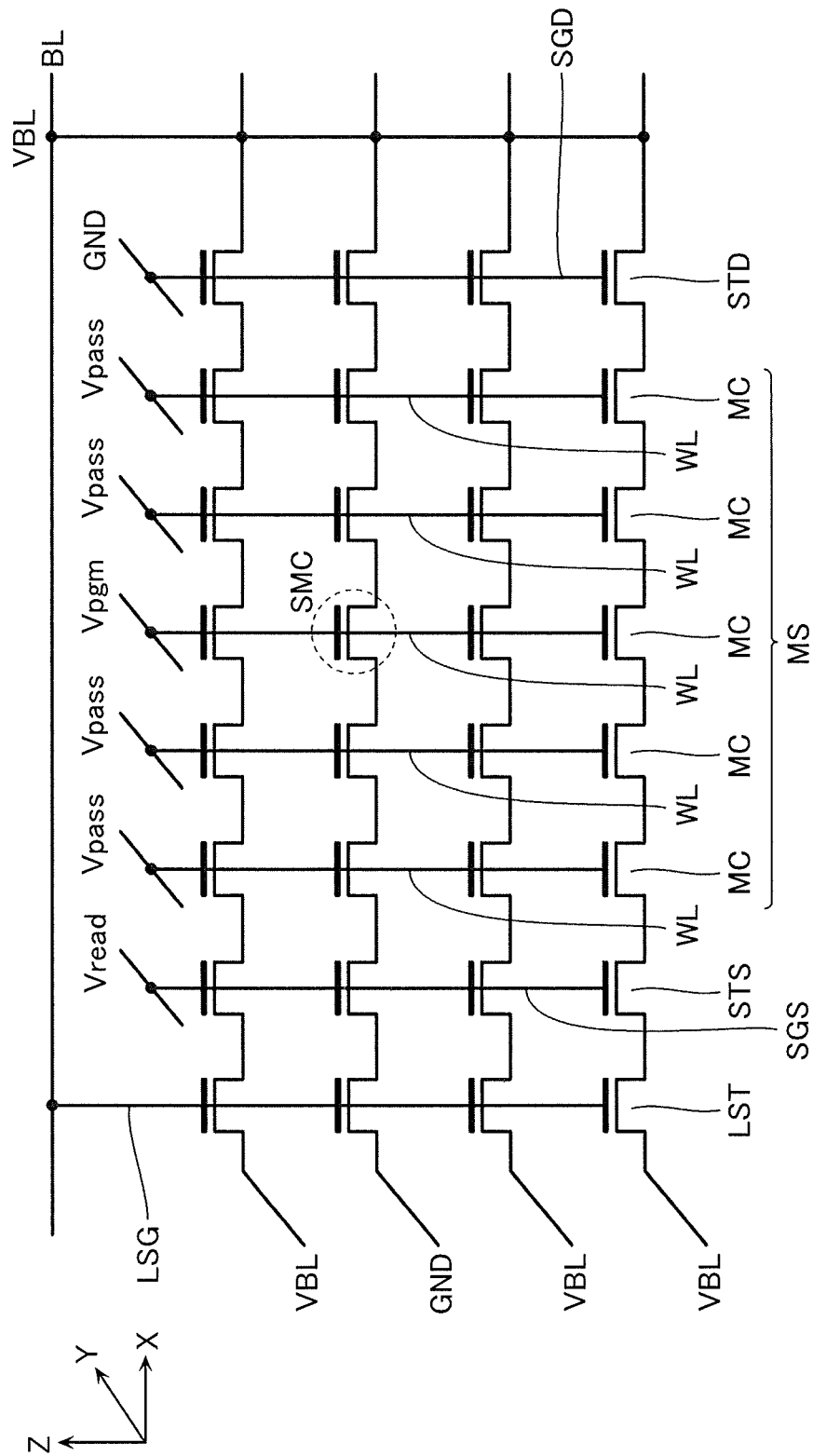

During the write operation, as shown in FIG. 5B, the bit line BL (layer select gate line LSG) connected to the memory block MB in which the selected memory cell SMC is included, is provided with the bit line voltage VBL. The word line WL connected to the selected memory cell SMC is provided with a write voltage Vpgm, and the unselected word lines WL are provided with a write pass voltage Vpass. The source line SL connected to the selected memory cell SMC is provided with the ground voltage GND, and the unselected source lines SL are provided with the bit line voltage VBL. Thereupon, due to a potential difference between the source line SL provided with the ground voltage GND and the bit line BL, the layer select transistor LST connected to that source line SL becomes on. As a result, the selected memory cell SMC alone becomes accessible, and a write by the write voltage Vpgm is enabled. The above-described operation explained an operation in the case of write permission, but in the case of write prohibition, the source line SL connected to the selected memory cell SMC is also provided with the bit line voltage VBL. Thereupon, because none of the layer select gate transistors LST becomes on, access, that is, write to all of the memory cells MC is prohibited. Note that during the write operation also, similarly to during the read operation, the bit line BL or layer select gate line LSG connected to other memory blocks MB arranged in the Y direction is provided with the ground voltage GND.

Figure 5C:
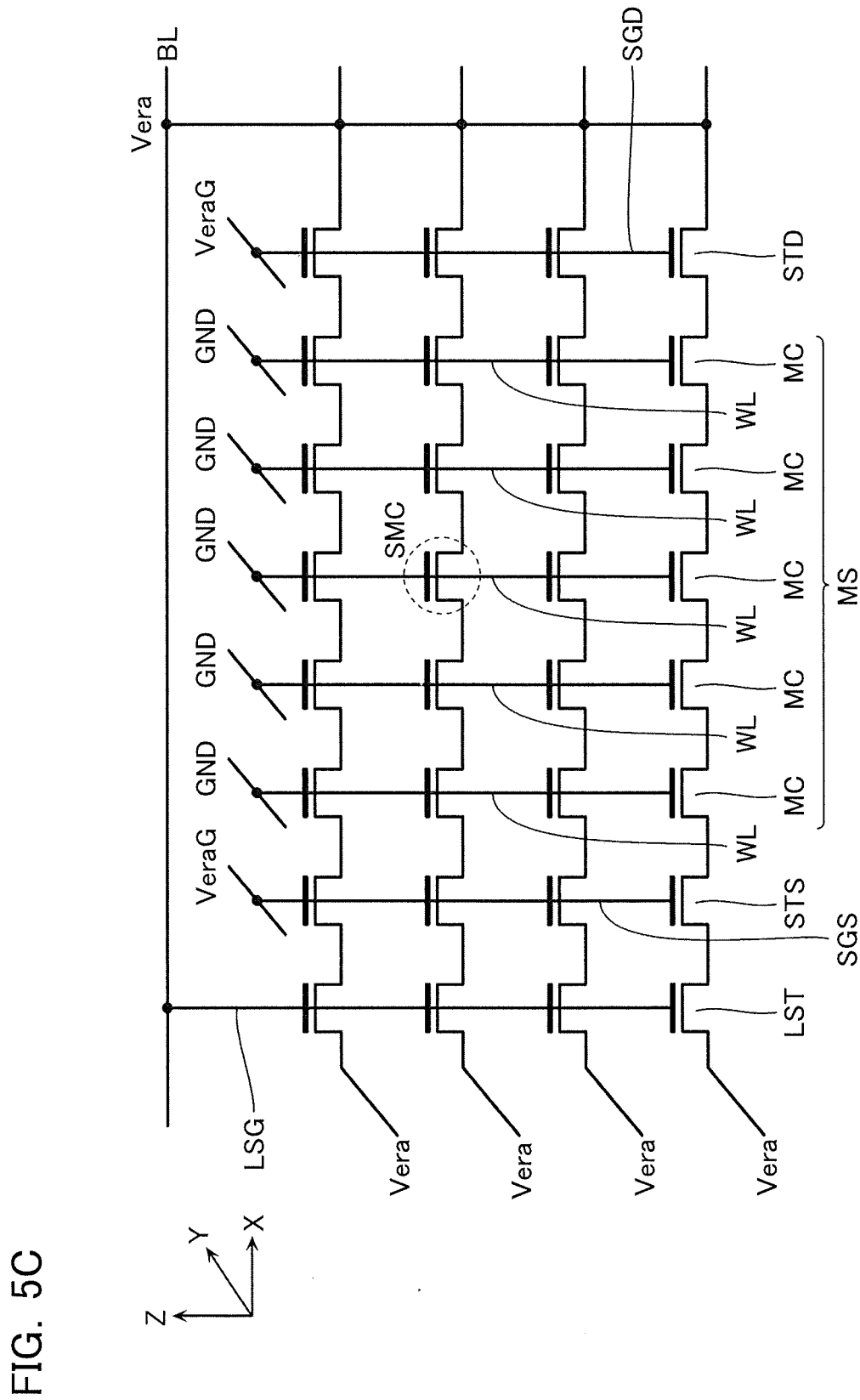

During the erase operation, as shown in FIG. 5C, the bit lines BL (layer select gate lines LSG) connected to the memory block MB in which the selected memory cell SMC is included and to the memory blocks MB in which the selected memory cell SMC is not included, are provided with an erase voltage Vera. All of the word lines WL including the word line WL connected to the selected memory cell SMC are provided with the ground voltage GND. The select gate lines SGS and SGD are provided with a voltage VeraG (VeraG<Vera). All of the source lines SL including the source line SL connected to the selected memory cell SMC are provided with the erase voltage Vera. Thereupon, the erase voltage Vera is transferred to a channel of each of the memory strings MS and due to a potential difference between each of the word lines WL and the potential GND, a charge accumulated in each of the memory cells MC is released and erased.

Operating applying each of wiring lines with the above kinds of voltages makes it possible to favorably maintain device characteristics even in a state where the bit line BL is shared between a plurality of the memory strings MS stacked in the Z direction. In other words, it becomes unnecessary that a stepped region for disposing the bit line BL is provided in a memory cell array region in order to connect the bit line BL to each layer. Therefore, area can be reduced to an extent of the stepped region, whereby both raised integration level and miniaturization can be achieved.

The above-described applied voltages during the operations are shown in the table of FIG. 5D. Note that X in the table means "unselected". For example, XWL is an unselected word line WL, and XBL is an unselected bit line BL.

Modified Example According to First Embodiment

Figure 6:
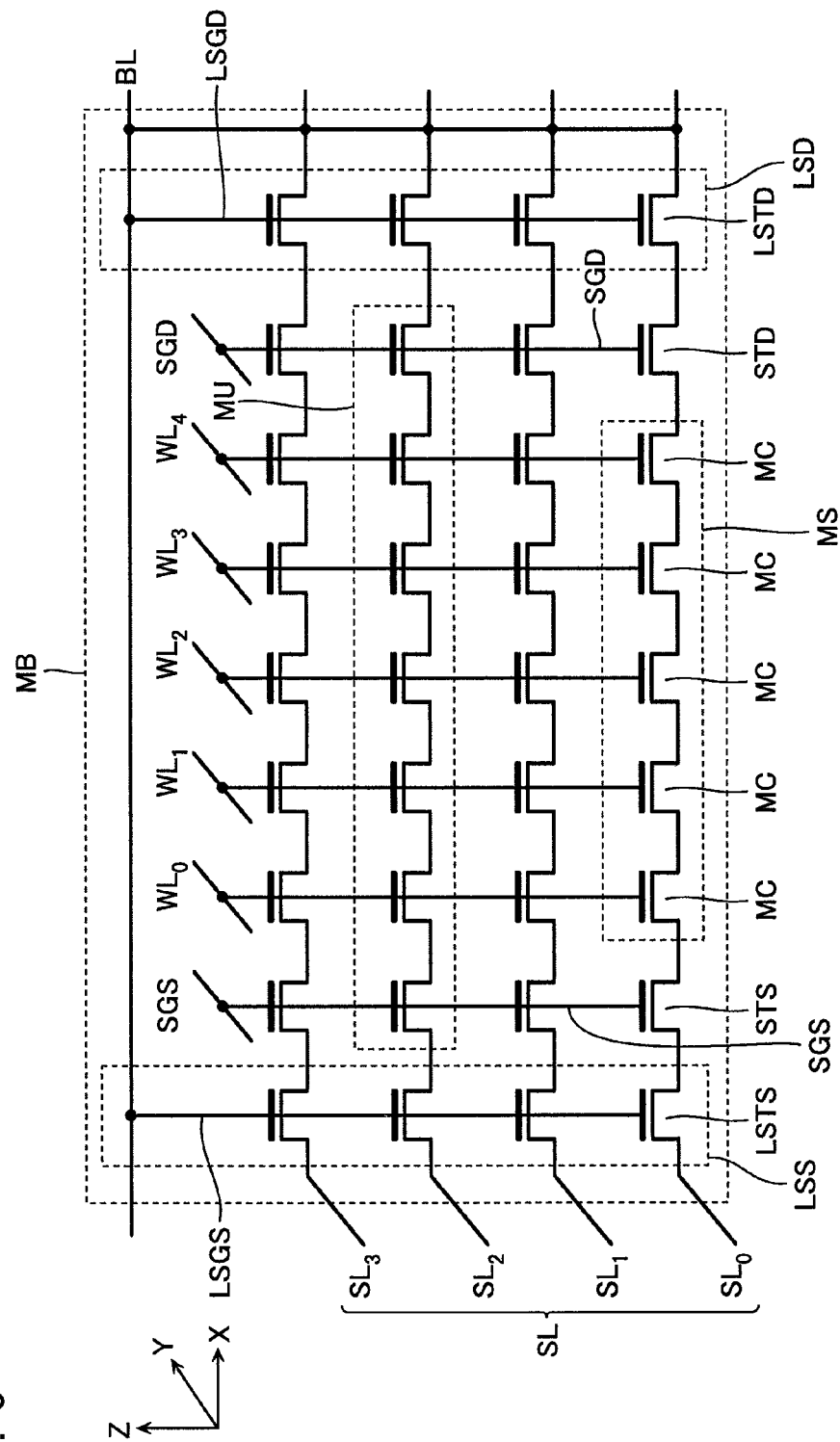
FIG. 6 is an equivalent circuit diagram showing a modified example according to the first embodiment.

In a modified example according to the first embodiment, as shown in FIG. 6, in addition to a source side layer selector LSS (source side layer select gate transistor LSTS and source side layer select gate line LSGS) disposed between the source line SL and the source side select gate line SGS, a drain side layer selector LSD (drain side layer select gate transistor LSTD and drain side layer select gate line LSGD) is provided also between the bit line BL and the drain side select gate line SGD.

Providing a layer select gate to each of the source side and the drain side of the memory block MB in this way makes it possible for noise on the source side during each of the operations, particularly during read, to be more reduced.

Second Embodiment

A semiconductor memory device according to a second embodiment is largely similar to the semiconductor memory device according to the first embodiment in overall configuration, in that the bit line BL is commonly connected to a plurality of the memory strings MS stacked in the Z direction, or that the layer selector LS is provided, and so on. Note that in the embodiment and modified examples below, configurations similar to those of the first embodiment will be assigned with identical reference symbols to those assigned in the first embodiment, and descriptions thereof will sometimes be omitted.

Figure 7:
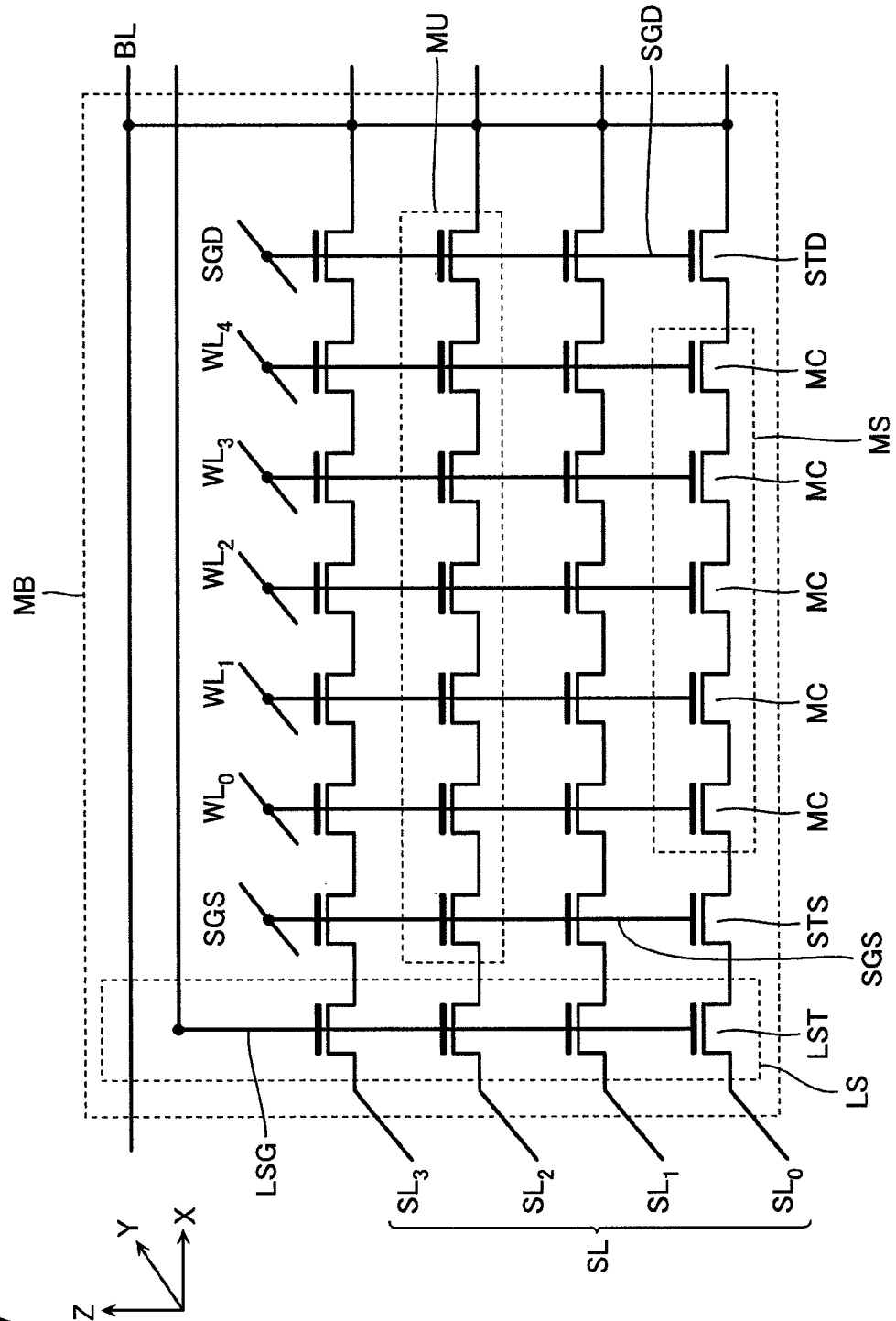
FIG. 7 is an equivalent circuit diagram showing a configuration of a semiconductor memory device according to a second embodiment.

In the semiconductor memory device according to the second embodiment, as shown in the equivalent circuit diagram of FIG. 7, the layer select gate line LSG and the bit line BL are isolated and not directly connected, and this differs from in the first embodiment.

Isolating the layer select gate line LSG and the bit line BL makes it possible for voltages applied to each to be adjusted and individually controlled, whereby device characteristics can be more finely controlled. In addition, it becomes possible for each of the layer select gate line LSG and the bit line BL to be separately formed, whereby freedom of design increases.

Figure 8:
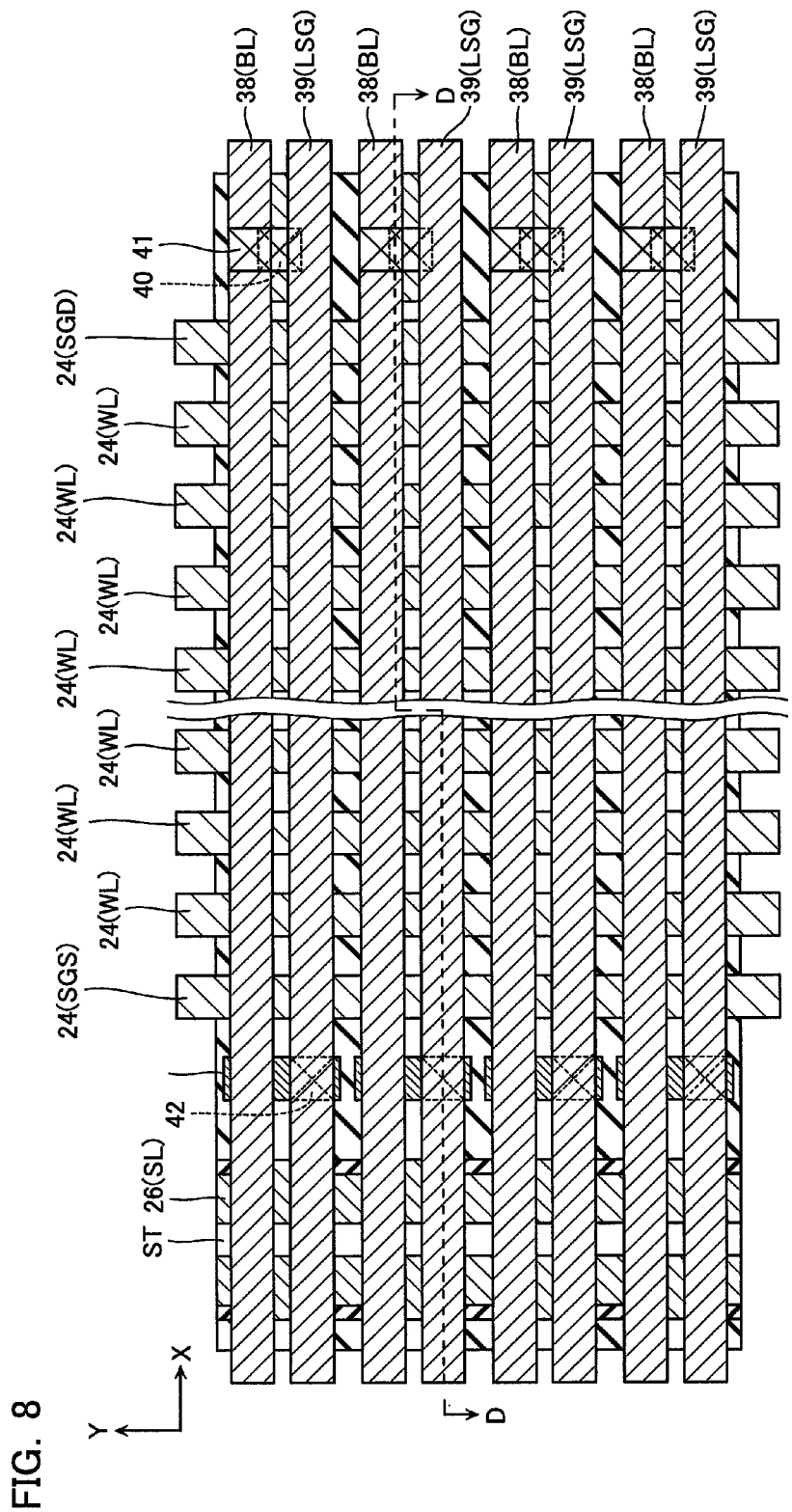
FIG. 8 is a schematic X-Y plane view showing a configuration of a memory cell array 1 of the same semiconductor memory device.
Figure 9:
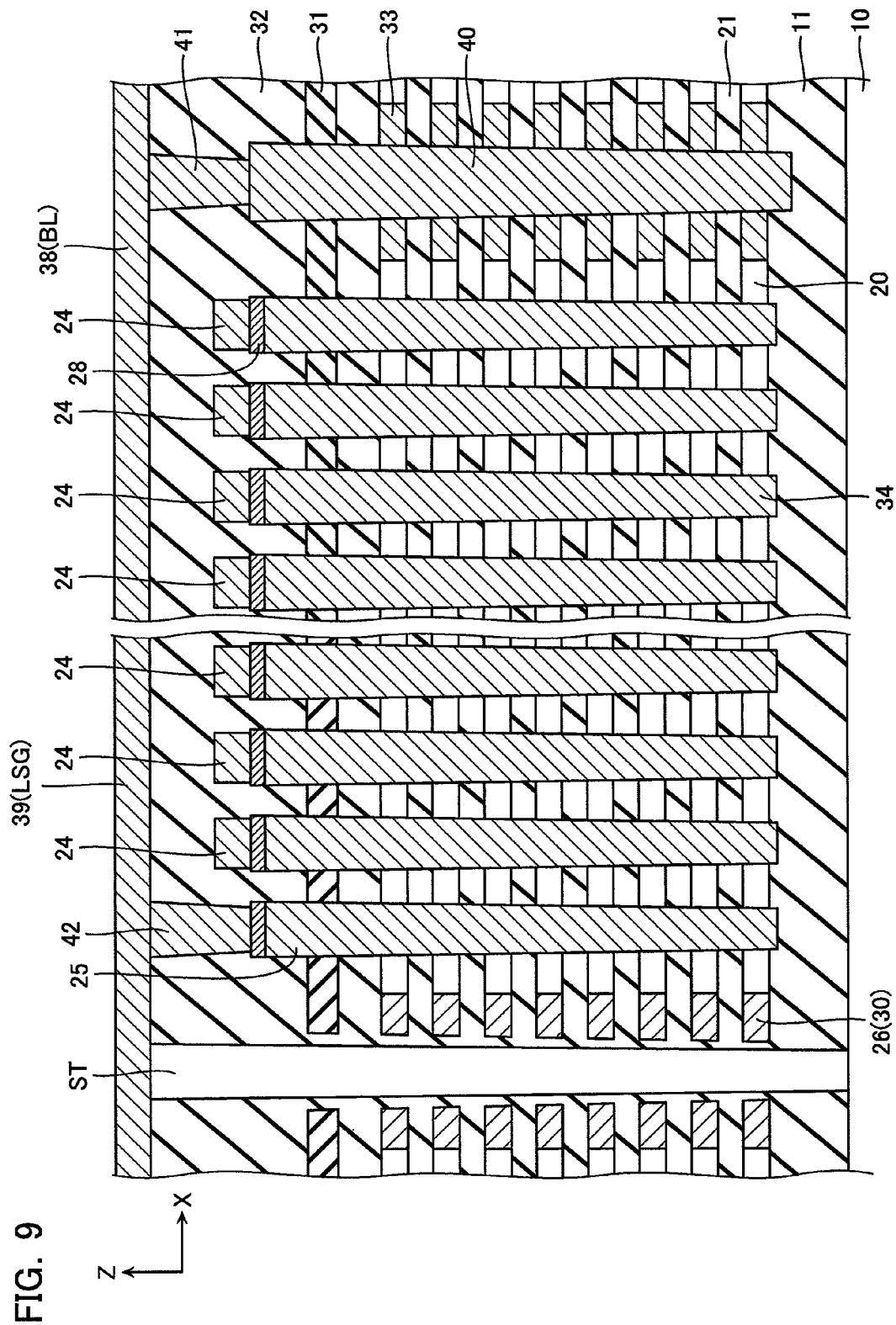
FIG. 9 is a schematic X-Z cross-sectional view, taken along the line D-D' of FIG. 8, showing a configuration of the same memory cell array 1.

FIG. 8 is an X-Y plane view showing a specific example of configuration of a memory cell array 1 according to the present embodiment, and corresponds to FIG. 3A. FIG. 9 is an X-Z cross-sectional view taken along the line D-D' of FIG. 8.

When the bit line BL and the layer select gate line LSG are isolated, a conductive layer 38 functioning as the bit line BL and a conductive layer 39 functioning as the layer select gate line LSG are disposed separated in the Y direction as shown in FIG. 8, to prevent them from contacting each other and being short-circuited. In addition, a bit line contact connecting the conductive layer 38 (bit line BL) and the memory string MS is configured from: a first bit line contact plug 40 connected to the bit line terminal 33; and a second bit line contact plug 41 connected to an upper surface of the first bit line contact plug 40 and a lower surface of the conductive layer 38. The second bit line contact plug 41 is disposed misaligned in the Y direction with the first bit line contact plug 40.

Moreover, in the present embodiment, as shown in FIG. 9, the conductive layer 38 and the conductive layer 39 are disposed at substantially identical heights in the Z direction.

Moreover, the conductive layer 39 (layer select gate line LSG) and the conductive layer 25 (layer select gate line LSG) are connected via a layer selector contact 42. The layer selector contact 42 is disposed misaligned in the Y direction reversely to the second bit line contact plug 41, with respect to the first bit line contact plug 40.

Modified Examples

Figure 10:
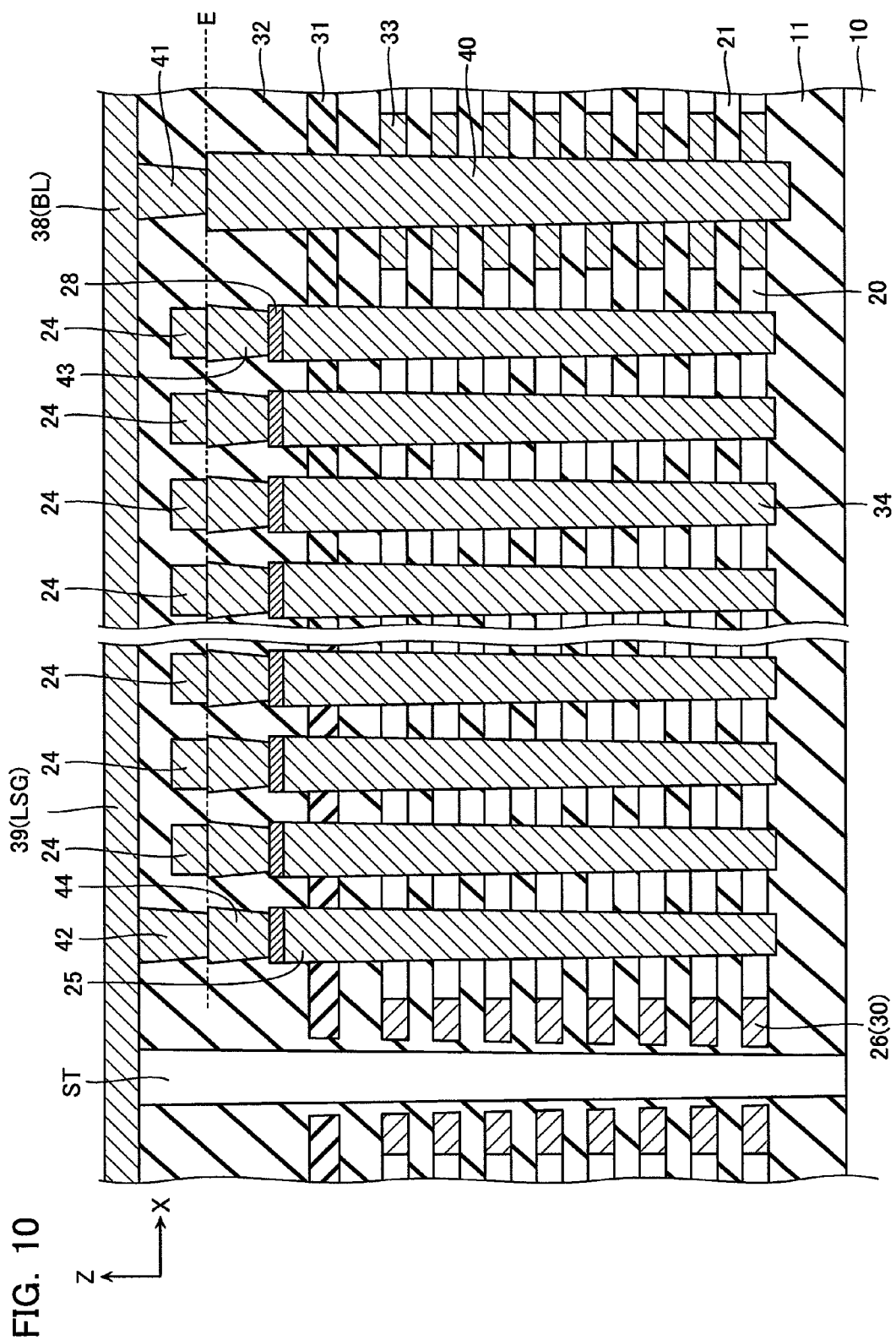
FIGS. 10 and 11 are schematic X-Z cross-sectional views showing modified examples according to the second embodiment.

In a modified example according to the second embodiment, as shown in FIG. 10, a word line contact plug 43 is disposed in order to electrically connect between the conductive layer 24 (word line WL) and the word line contact 28. In addition, a layer selector contact plug 44 is disposed also between the conductive layer 25 (layer select gate line LSG) and the layer selector contact 42.

As shown by the dotted line E, a height of the upper surface of the first bit line contact plug 40, a height of an upper surface of the word line contact plug 43, and a height of an upper surface of the layer selector contact plug 44 are aligned. This configuration makes it possible for the second bit line contact plug 41 and the layer selector contact 42 to be processed collectively.

Figure 11:
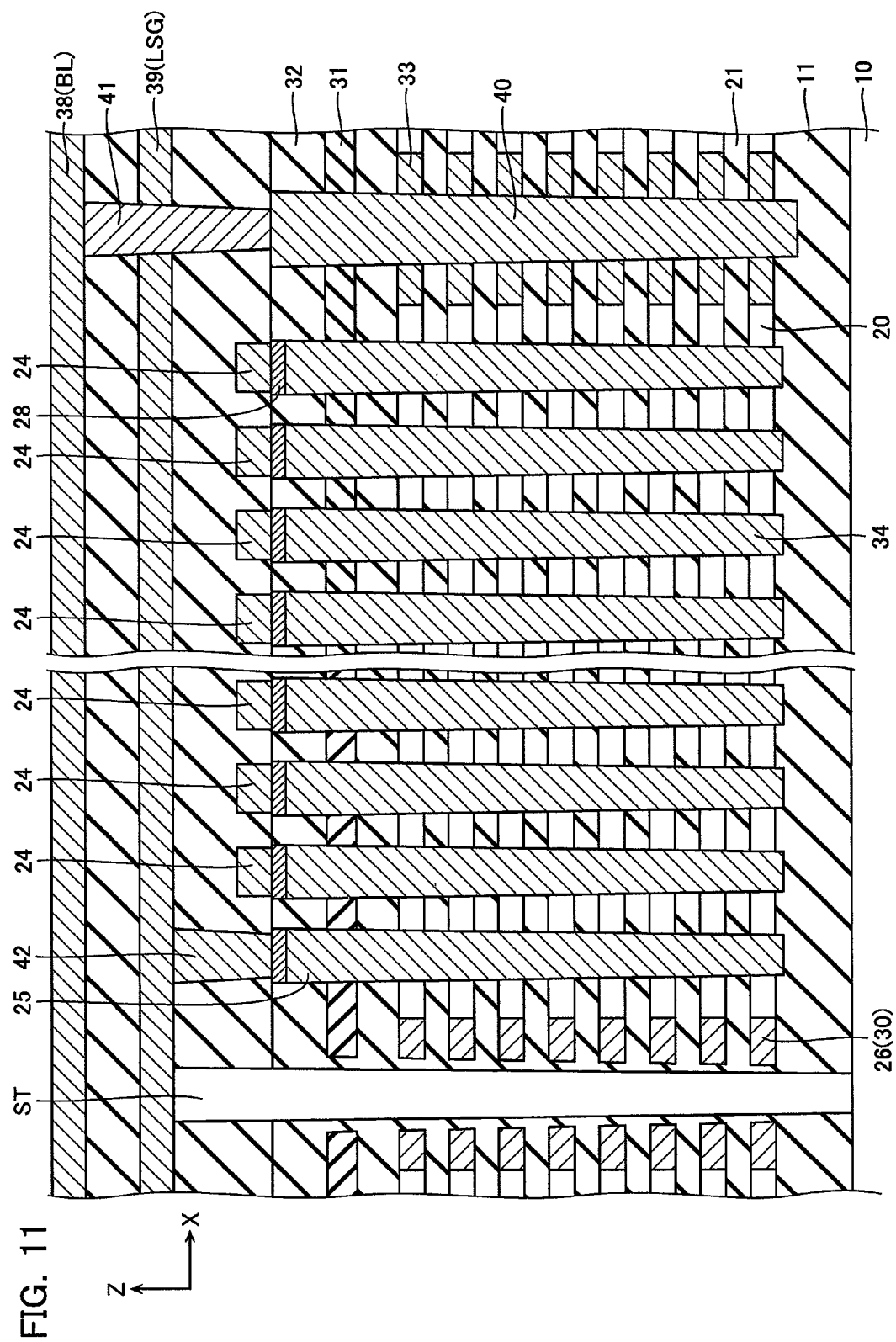

In yet another modified example, as shown in FIG. 11, heights at which the conductive layer 38 (bit line BL) and the conductive layer 39 (layer select gate line LSG) are disposed are different, and this differs from in the second embodiment.

That is, the conductive layer 38 (bit line BL) and the conductive layer 39 (layer select gate line LSG) are disposed at different heights in the Z direction.

Disposing the conductive layer 38 (bit line BL) and the conductive layer 39 (layer select gate line LSG) in separate layers as in the present modified example makes it possible to reduce a risk of the bit line BL and the layer select gate line LSG short-circuiting even when a width of the active area AA (a pitch of each of the bit line BL and layer select gate line LSG) has narrowed. Note that in FIG. 11, the conductive layer 38 (bit line BL) is disposed more upwardly than the conductive layer 39 (layer select gate line LSG), but it is of course also possible for a positional relationship to be reversed.

Others

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor memory device, comprising:
   a plurality of memory strings arranged along a first direction intersecting a surface of a semiconductor substrate, each of the memory strings including a plurality of memory transistors connected in series in a second direction along the surface of the semiconductor substrate;
   a source side select transistor connected to one end of the memory string;
   a drain side select transistor connected to the other end of the memory string;
   a plurality of source lines connected, via the source side select transistor, to corresponding each of the plurality of memory strings arranged along the first direction;
   a bit line commonly connected, via the drain side select transistor, to the plurality of memory strings arranged along the first direction;
   a word line connected to a gate electrode of the memory transistor; and
   a layer selector disposed between the source line and the source side select transistor and commonly connected to the plurality of memory strings arranged along the first direction, wherein
   the source line extends in a third direction intersecting the second direction and the first direction, and is arranged in plurality along the first direction, and
   the source line is provided with a slit extending in the third direction.

2. The semiconductor memory device according to claim 1, wherein
   the layer selector includes a layer select gate line, and
   the layer select gate line and the bit line are connected.

3. The semiconductor memory device according to claim 1, further comprising
   a second layer selector disposed between the bit line and the drain side select transistor and commonly connected to the plurality of memory strings arranged along the first direction.

4. The semiconductor memory device according to claim 1, wherein
   the layer selector includes a layer select gate line, and
   the layer select gate line and the bit line are insulated from each other.

5. The semiconductor memory device according to claim 1, wherein the bit line extends in the second direction and is arranged in plurality along the first third direction.

6. The semiconductor memory device according to claim 1, wherein
the layer selector extends in the first direction and is arranged in plurality along the third direction.

7. The semiconductor memory device according to claim 1, wherein
the memory transistor comprises:
a semiconductor channel layer acting as a channel body of the memory transistor; and
a memory film disposed between the gate electrode and the semiconductor channel layer.

8. The semiconductor memory device according to claim 7, wherein
the semiconductor channel layer extends in the second direction and is arranged in plurality along the first direction.

9. The semiconductor memory device according to claim 1, wherein
the layer selector commonly switches electrical connection between the plurality of memory strings disposed in plurality along the first direction and the plurality of source lines.

10. The semiconductor memory device according to claim 1, wherein
the plurality of memory strings are arranged also along the third direction.

11. The semiconductor memory device according to claim 4, wherein
the layer select gate line and the bit line are disposed at substantially identical heights in the first direction and are disposed separated in the third direction.

12. The semiconductor memory device according to claim 4, wherein
the layer select gate line and the bit line are disposed at different heights in the first direction and are disposed separated in the third direction.

13. The semiconductor memory device according to claim 1, further comprising:
a bit line contact disposed extending in the first direction; and
a plurality of bit line terminals disposed to each of the plurality of memory strings arranged along the first direction, and each connected to the bit line.

14. The semiconductor memory device according to claim 4, further comprising
a layer selector contact which is provided between the layer selector and the layer select gate line and which connects the layer selector and the layer select gate line.

15. The semiconductor memory device according to claim 14, further comprising
a layer selector contact plug which is provided between the layer selector and the layer selector contact and which connects the layer selector and the layer selector contact.

16. The semiconductor memory device according to claim 1, further comprising
a word line contact plug which is provided between the gate electrode and the word line and which connects the gate electrode and the word line.

17. The semiconductor memory device according to claim 4, further comprising:
a bit line contact plug which is provided between the bit line contact and the bit line and which connects the bit line contact and the bit line;
a layer selector contact which is provided between the layer selector and the layer select gate line and which connects the layer selector and the layer select gate line;
a layer selector contact plug which is provided between the layer selector and the layer selector contact and which connects the layer selector and the layer selector contact; and
a word line contact plug which is provided between the gate electrode and the word line and which connects the gate electrode and the word line,
wherein heights in the second direction of the bit line contact, the layer selector contact plug, and the word line contact plug are substantially identical.

18. The semiconductor memory device according to claim 1, wherein
the semiconductor memory device has a line symmetrical configuration in the second direction, bounded by the slit.

19. A semiconductor memory device, comprising:
a plurality of memory strings arranged along a first direction intersecting a surface of a semiconductor substrate, each of the memory strings including a plurality of memory transistors connected in series in a second direction along the surface of the semiconductor substrate;
a source side select transistor connected to one end of the memory string;
a drain side select transistor connected to the other end of the memory string;
a plurality of source lines connected, via the source side select transistor, to corresponding each of the plurality of memory strings arranged along the first direction;
a bit line commonly connected, via the drain side select transistor, to the plurality of memory strings arranged along the first direction;
a word line connected to a gate electrode of the memory transistor; and
a layer selector disposed between the source line and the source side select transistor and commonly connected to the plurality of memory strings arranged along the first direction, wherein
the layer selector includes a layer select gate line,
the layer select gate line and the bit line are insulated from each other, and
the semiconductor memory device further comprises a layer selector contact which is provided between the layer selector and the layer select gate line and which connects the layer selector and the layer select gate line.

20. The semiconductor memory device according to claim 19, further comprising
a layer selector contact plug which is provided between the layer selector and the layer selector contact and which connects the layer selector and the layer selector contact.

* * * * *